(12) United States Patent
Davidow et al.

(10) Patent No.: US 6,455,437 B1
(45) Date of Patent: Sep. 24, 2002

(54) METHOD AND APPARATUS FOR MONITORING THE PROCESS STATE OF A SEMICONDUCTOR DEVICE FABRICATION PROCESS

(75) Inventors: Jed Davidow, Santa Clara; Moshe Sarfaty, Cupertino; Dimitris Lymberopoulos, Santa Clara, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/288,041

(22) Filed: Apr. 7, 1999

(51) Int. Cl.[7] .............................................. H01L 21/302
(52) U.S. Cl. ...................... 438/710; 438/714; 438/716
(58) Field of Search ................................ 438/710, 708, 438/709, 714, 716, 16; 156/345

(56) References Cited

U.S. PATENT DOCUMENTS

| | | | |
|---|---|---|---|
| 5,308,414 A | * 5/1994 | O'Neill et al. ................. 216/60 |
| 5,450,205 A | * 9/1995 | Sawin et al. ................... 438/16 |
| 5,552,016 A | 9/1996 | Ghanayem .................. 156/345 |
| 5,576,629 A | * 11/1996 | Turner et al. ................ 156/345 |
| 5,759,424 A | * 6/1998 | Imatake et al. ............... 216/60 |
| 5,812,261 A | * 9/1998 | Nelson ........................ 356/318 |
| 5,846,373 A | 12/1998 | Pirkle et al. ................. 156/345 |
| 5,971,591 A | * 10/1999 | Vona et al. .................. 438/710 |
| 5,996,415 A | * 12/1999 | Stanke et al. ................. 73/597 |
| 6,104,487 A | * 4/2000 | Buck et al. .................. 356/316 |

OTHER PUBLICATIONS

D.W. Buck, "Audio Frequency Plasma Sensor", as presented at 1997 Sematech, Lake Tahoe (Sep. 22, 1997).

* cited by examiner

Primary Examiner—Benjamin L. Utech
Assistant Examiner—Binh X Tran
(74) Attorney, Agent, or Firm—Dugan and Dugan; Joseph Bach

(57) ABSTRACT

A method and apparatus for monitoring process state using plasma attributes are provided. Electromagnetic emissions generated by a plasma are collected, and a detection signal having at least one frequency component is generated based on the intensity of the collected electromagnetic emissions; or, the RF power delivered to a wafer pedestal is monitored and serves as the detection signal. The magnitude of at least one frequency component of the detection signal then is monitored over time. By monitoring the magnitude of at least one frequency component of the detection signal over time, a characteristic fingerprint of the plasma process is obtained. Features within the characteristic fingerprint provide process state information, process event information and process chamber information. In general, any chemical reaction having an attribute that varies with reaction rate may be similarly monitored.

37 Claims, 11 Drawing Sheets

METHOD AND APPARATUS FOR MONITORING THE PROCESS STATE OF A SEMICONDUCTOR DEVICE FABRICATION PROCESS

FIELD OF THE INVENTION

The present invention relates to semiconductor device manufacturing, and more particularly to a method and apparatus for monitoring the process state of a semiconductor device fabrication process.

BACKGROUND OF THE INVENTION

Within the semiconductor industry, an ever present need exists for improved process repeatability and control. For example, during the formation of a typical metal-layer-to-metal-layer interconnect a dielectric layer is deposited over a first metal layer, a via hole is etched in the dielectric layer to expose the first metal layer, the via hole is filled with a metal plug and a second metal layer is deposited over the metal plug (e.g., forming an interconnect between the first and the second metal layers). To ensure the interconnect has low contact resistance, all dielectric material within the via hole must be etched from the top surface of the first metal layer prior to formation of the metal plug thereon; otherwise, residual high-resistivity dielectric material within the via hole significantly degrades the contact resistance of the interconnect. Similar process control is required during the etching of metal layers (e.g., Al, Cu, Pt, etc.), polysilicon layers and the like.

Conventional monitoring techniques provide only a rough estimate of when a material layer has been completely etched (i.e., endpoint). Accordingly, to accommodate varying thicknesses of material layers (e.g., device variations) or varying etch rates of material layers (e.g., process/process chamber variations), an etch process may be continued for a time greater than a predicted time for etching the material layer (i.e., for an over-etch time). Etching for an over-etch time ensures that all material to be removed is removed despite device variations that increase the required etch time and despite process/process chamber variations which slow etch rate (and thus increase the required etch time).

While over-etch times ensure complete etching, over-etching increases the time required to process each semiconductor wafer and thus decreases wafer throughput. Further, the drive for higher performance integrated circuits requires each generation of semiconductor devices to have finer dimensional tolerances, making over-etching increasingly undesirable. A more attractive solution is a monitoring technique that identifies the causes of device variations and process/process chamber variations (e.g., chamber faults, improper reaction chemistries, improper etch rates, etc.) and that more accurately identifies processing events such as endpoint. However, no conventional monitoring technique provides sufficient information to serve both as a diagnostic tool that identifies deleterious process/process chamber variations and as a device processing control tool that tracks process progress accurately enough to reduce over-etch or other over-processing times required to compensate for both process/process chamber variations and device variations (e.g., material layer thickness variations, etch property variations, etc.).

Accordingly, a need exists for an improved method and apparatus for monitoring semiconductor device fabrication processes.

SUMMARY OF THE INVENTION

The present inventors have discovered that during a plasma process certain plasma "attributes" such as a plasma's electromagnetic emissions or the RF power delivered to a wafer pedestal manifest low frequency fluctuations that contain significant information about the plasma process and the plasma chamber. For example, the intensity fluctuations of a plasma's electromagnetic emissions (hereinafter "plasma emission fluctuations") have been found to contain information that falls within three broad categories:

(1) process state information such as plasma etch rate, RF power, wafer damage, wafer temperature, etch uniformity, plasma reaction chemistry, etc.;

(2) process event information such as when a particular material has been etched through or away (i.e., breakthrough), when a wafer is improperly held (i.e., improper "chucking"), etc.; and (3) process chamber information such as whether a chamber contains a fault, whether a chamber's operation is similar to its previous operation or to another chamber's operation (i.e., chamber matching), etc.

Similar information has been found within the fluctuations of the RF power delivered to a wafer pedestal during plasma processing.

To monitor plasma emission fluctuations, electromagnetic emissions generated by a plasma are collected, and a detection signal having at least one frequency component (having a magnitude associated therewith) is generated based on the intensity of the collected electromagnetic emissions. The magnitude of at least one frequency component of the detection signal then is monitored over time. Preferably frequency components having frequencies less than the RF frequency used to generate the plasma (e.g., 13.56 MHz), and most preferably less than about 50 kHz, are monitored over time. The preferred collected electromagnetic emissions comprise emissions having wavelengths within the range of about 200 to 1100 nanometers (i.e., broadband optical electromagnetic emissions), although other ranges may be employed. The electromagnetic emissions of particular chemical species associated with the plasma process (e.g., Al, AlCl, or BCl for an aluminum etch process) also may be monitored.

To monitor RF power fluctuations, the RF power (e.g., forward and/or reflected) delivered to a wafer pedestal during plasma processing is monitored and serves as the "detection" signal. The magnitude of at least one frequency component of the detection signal then is monitored over time. Preferably frequency components having frequencies less than the RF frequency used to generate the plasma (e.g., 13.56 MHz), and most preferably less than about 50 kHz, are monitored over time.

By monitoring the magnitude of at least one frequency component of a plasma emission fluctuation detection signal or of an RF power fluctuation detection signal over time, a characteristic fingerprint of a plasma process is obtained. The present inventors have discovered that features (e.g., the magnitude of frequency components and the position in time ("temporal position") of frequency components) within a characteristic fingerprint provide process state information, process event information and process chamber information. These features may be monitored after a plasma process is performed or during the plasma process to allow for real-time process state control. In general, any chemical reaction having an attribute that varies with reaction rate may be similarly monitored (e.g., whether or not a plasma is employed and whether or not related to semiconductor device fabrication).

DETAILED DESCRIPTION

Figure 1A:
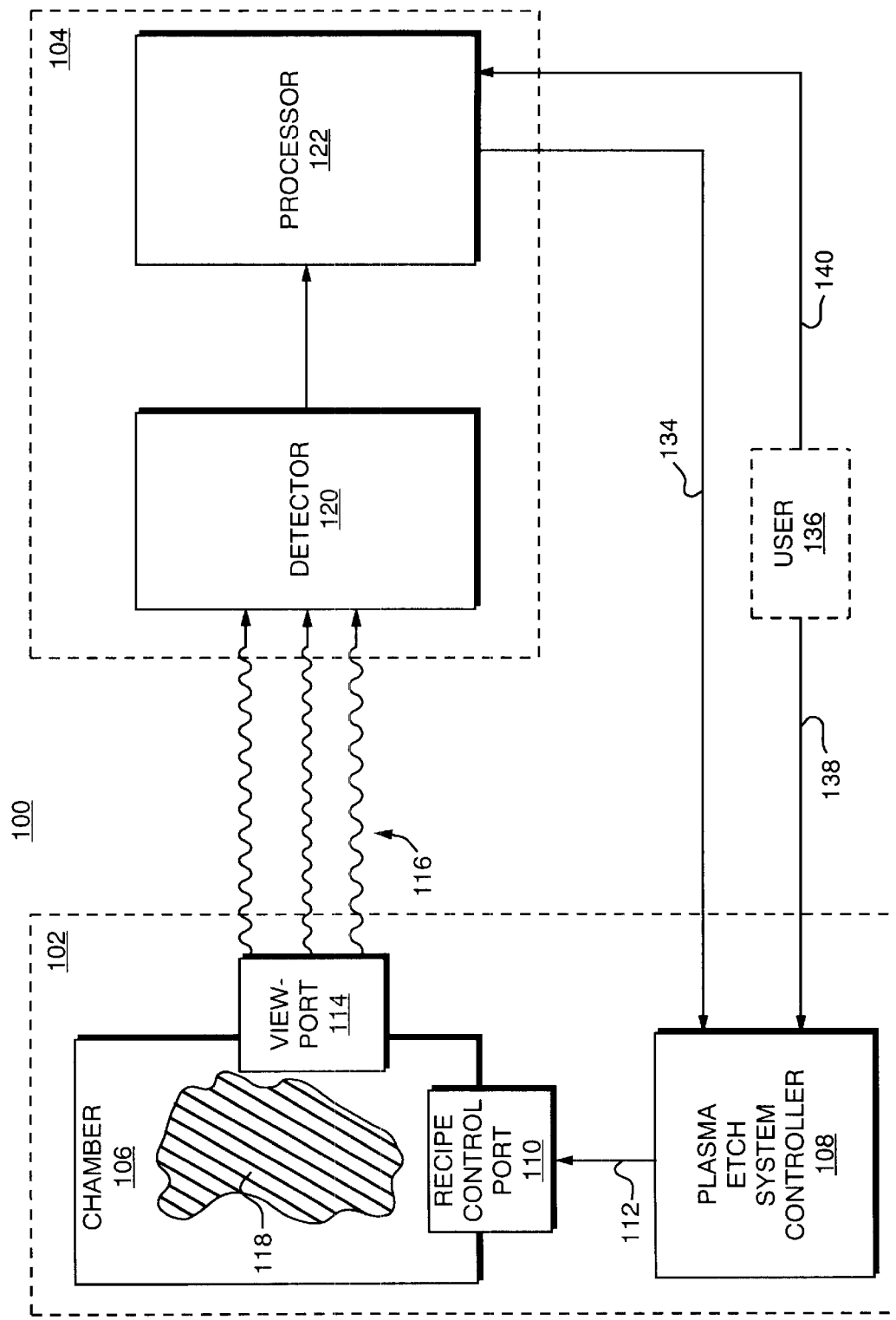
FIGS. 1A–C are schematic diagrams of a plasma processing system employing an inventive process monitoring system in accordance with the present invention.

FIG. 1A is a schematic diagram of a processing system 100 comprising a conventional plasma etching system 102 and an inventive process monitoring system 104 coupled thereto in accordance with the present invention. As used herein, "coupled" means coupled directly or indirectly so as to operate.

The conventional plasma etching system 102 comprises a plasma chamber 106 coupled to a plasma etch system controller 108 via a recipe control port 110 and via a first control bus 112. It will be understood that while a singular interface (e.g., the recipe control port 110) is shown between the plasma chamber 106 and the plasma etch system controller 108 for convenience, in general, the plasma etch system controller 108 may interface the various mass flow controllers, RF generators, temperature controllers, etc., associated with the plasma chamber 106 via a plurality of interfaces (not shown).

The plasma chamber 106 comprises a viewport 114 for outputting electromagnetic emissions (e.g., primarily optical wavelengths within the range from about 200 to 1100 nanometers, generally represented as 116 in FIGS. 1A–1C) from a plasma 118 sustained within the plasma chamber 106 (described below). While the viewport 114 is shown positioned on the side of the plasma chamber 106, it will be understood that the viewport 114 may be positioned at any other location (e.g., on the top or bottom of the chamber 106).

The inventive process monitoring system 104 comprises a detector 120 coupled to a processing mechanism (e.g., a processor 122). The detector 120 is positioned to collect the electromagnetic emissions 116 from the plasma 118 and preferably comprises a broadband photodiode such as a silicon photodiode. The detector 120 alternatively may comprise a monochrometer 126 coupled to a photomultiplier tube 128 (FIG. 1B) for detecting electromagnetic emissions from specific chemical species as described below. A lens 130 and a fiber optic cable 132 also may be disposed between the viewport 114 and the detector 120 (FIG. 1C) for improving collection of the electromagnetic emissions 116 by the detector 120 (e.g., by coupling the electromagnetic emissions 116 into the fiber optic cable 132 via the lens 130 and by transporting the electromagnetic emissions 116 to the detector 120 via the fiber optic cable 132). Other alternative configurations for collecting electromagnetic emissions from the plasma 118 may be employed such as a photodiode array wherein each photodiode monitors a different wavelength or a different wavelength spectrum. If desired, a bundle of fiber optic cables may be coupled to the diode array wherein each fiber optic cable within the bundle is coupled to a unique photodiode and supplies electromagnetic emissions thereto. Similarly, diffraction gratings, prisms, optical filters (e.g., glass filters) and other wavelength selective devices may be employed in place of the monochrometer 126. The processor 122 is coupled to the plasma etch system controller 108 via a second control bus 134.

In operation, a user 136 (e.g., a person in charge of a wafer fabrication process) supplies (via a third control bus 138) the plasma etch system controller 108 with a set of instructions for generating the plasma 118 within the plasma chamber 106 (i.e., a plasma recipe). Alternatively, a remote computer system for running a fabrication process that includes the processing system 100, a manufacturing execution system or other fabrication control systems may supply the plasma etch system controller 108 with a plasma recipe (e.g., as supplied by the user 136 or as stored within a plasma recipe database). A typical plasma recipe includes processing parameters such as the pressure, temperature, power, gas types, gas flow rates and the like used to initiate and maintain the plasma 118 within the plasma chamber 106 during plasma processing. For example, to perform aluminum etching within the plasma chamber 106, a typical plasma recipe would include at least the following: a desired chamber pressure, a desired process temperature, a desired RF power level, a desired wafer bias, desired process gag flow rates (e.g., desired flow rates for process gasses such as Ar, $BCl_3$ or $Cl_2$), etc. Once the plasma etch system controller 108 receives a plasma recipe from the user, from a remote computer system, from a manufacturing execution system, etc., the plasma recipe is supplied to the recipe control port 110 via the first control bus, and the recipe control port 110 (or the plasma etch system controller 108 itself) establishes and maintains within the plasma chamber 106 the processing parameters specified by the plasma recipe.

During a plasma process within the plasma chamber 106, the plasma 118 generates electromagnetic emissions having wavelengths primarily in the optical spectrum (e.g., from about 200 to 1100 nanometers), although both ultra-violet and infrared wavelengths also may result. A portion of these electromagnetic emissions (e.g., the electromagnetic emissions 116) travel through the viewport 114 and reach the inventive process monitoring system 104. Note that while the electromagnetic emissions 116 are represented generally by three emission wavelengths in FIGS. 1A–1C, it will be understood that the electromagnetic emissions 116 typically comprise many more wavelengths.

Figure 1B:
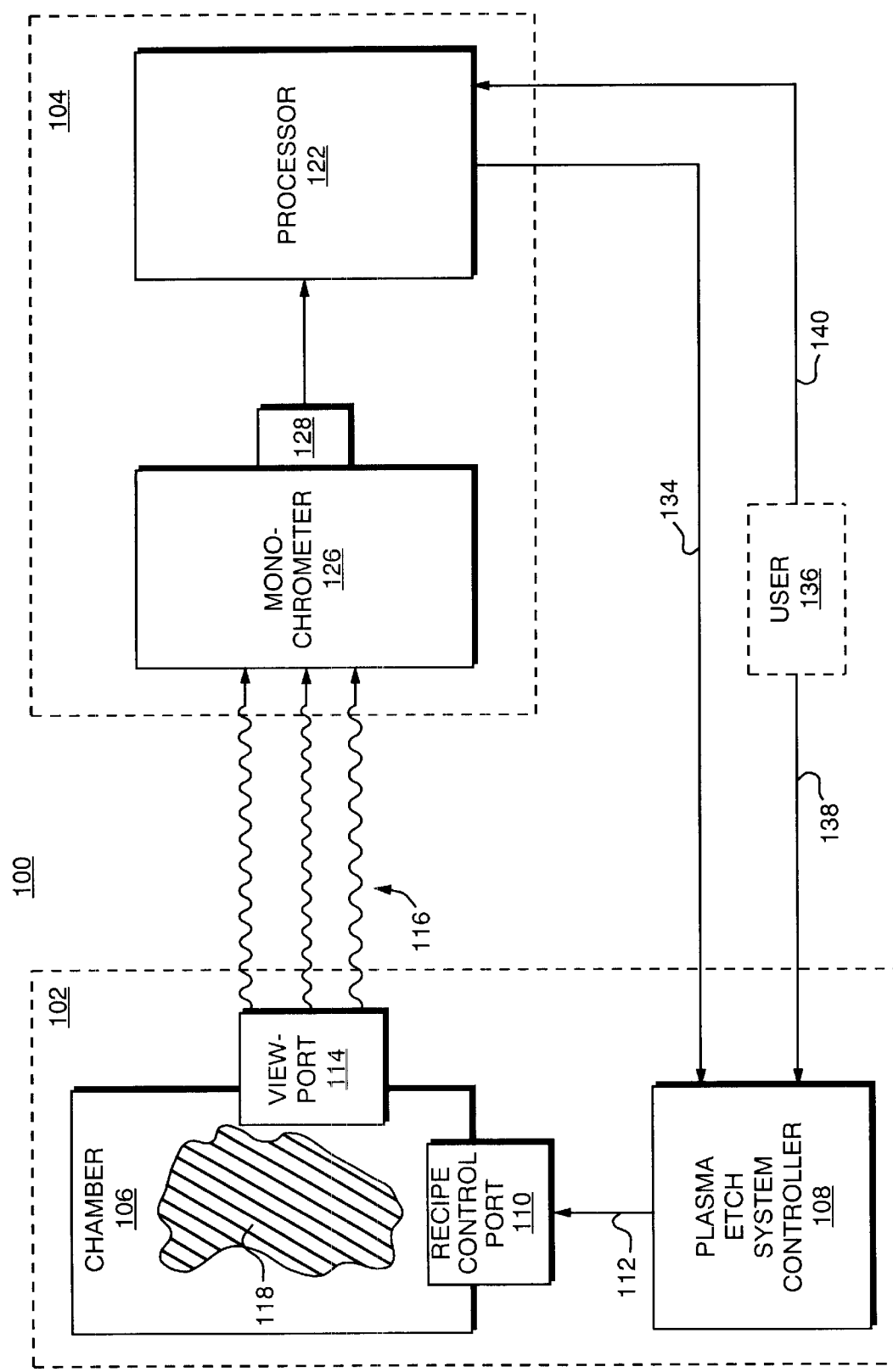
Figure 1C:
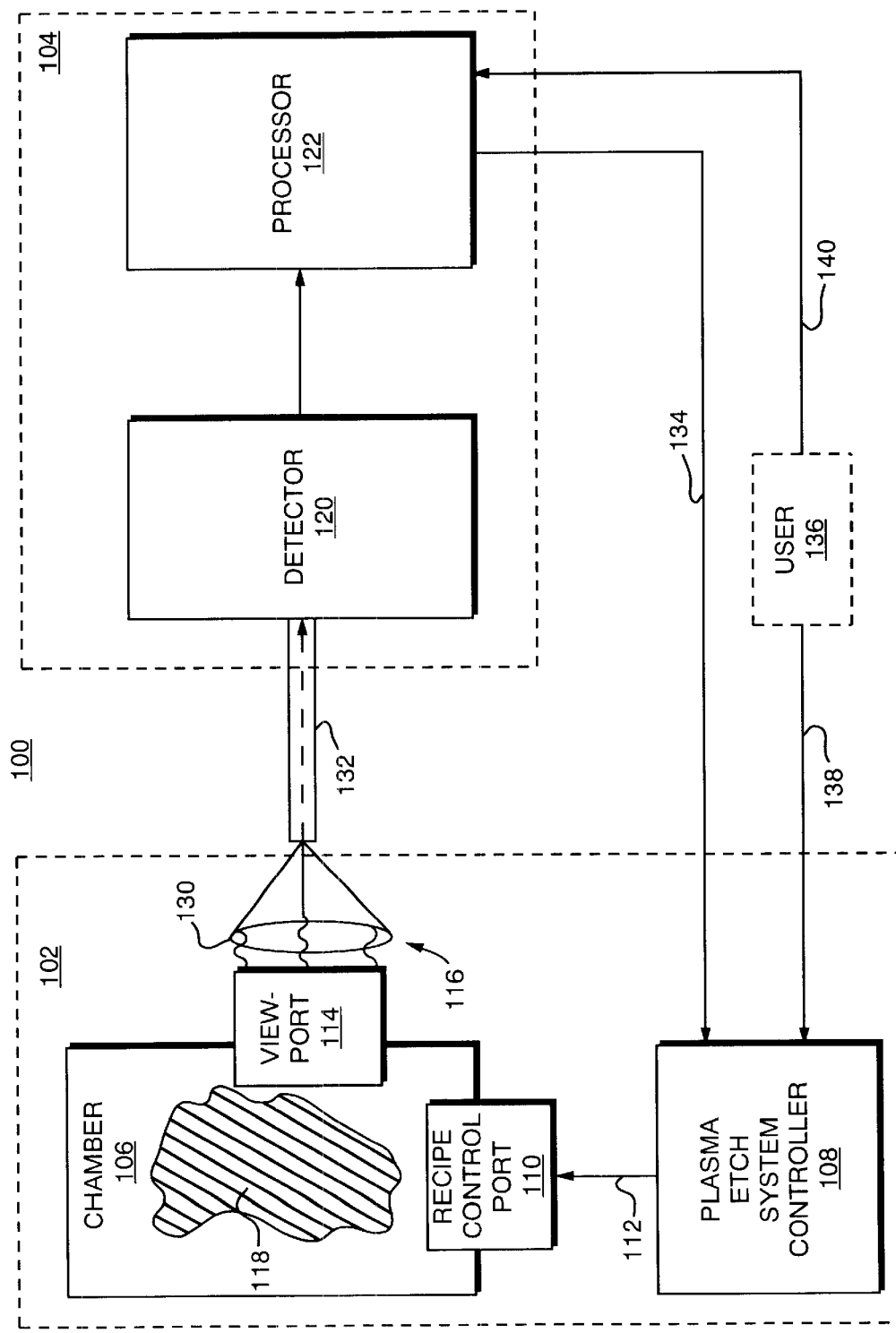

With reference to FIGS. 1A and 1C, the detector 120 receives the electromagnetic-emissions 116 either directly (FIG. 1A) or indirectly via the lens 130 and the fiber optic cable 132 (FIG. 1C). Assuming the detector 120 is a silicon photodiode, the detector 120 detects the intensity of electromagnetic emissions within the broad wavelength range from about 200 to 1100 nanometers (hereinafter the "optical emission spectrum (OES)"), and in response thereto, generates a detection signal (e.g., an optical emission current signal or an "OE signal") proportional to the intensity of the detected electromagnetic emissions. The detector 120 then outputs the OE signal, the OE signal is appropriately amplified (e.g., via a pre-amplifier not shown) and the OE signal is supplied to the processor 122 for subsequent processing (described below). The particular type of processing to be performed by the processor 122 preferably is selected by the user 136 (or by a remote computer system, by a manufacturing execution system, etc.) via a fourth control bus 140. Thus, in accordance with the present invention, an attribute (e.g., electromagnetic emissions) of the plasma 118 is measured via the detector 120, and a detection signal (e.g., an OE signal) is generated by the detector 120. As described below, the processor 122 monitors over time the magnitude of at least one frequency component of the detection signal.

Figure 2:
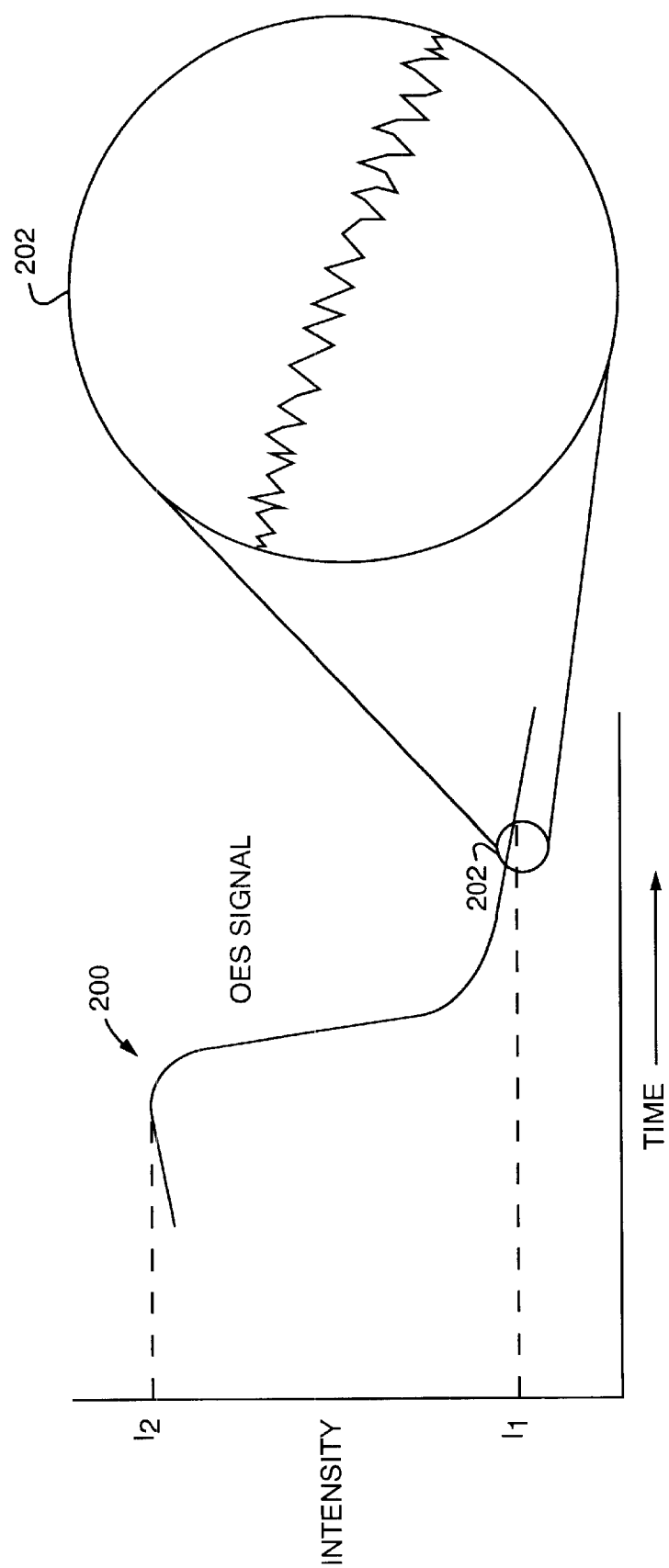
FIG. 2 is a representative graph of an optical emission spectrum signal generated by the inventive process monitoring system of FIG. 1A.

FIG. 2 is a representative graph of an OE signal 200 output by the detector 120. In accordance with the present invention, instead of examining the overall magnitude changes of the OE signal 200 over time, (e.g., the change in intensity from $I_1$ to $I_2$) as is conventional, the processor 122 examines over time local frequency changes (e.g., changes in the magnitudes of frequency components) in the OE signal (e.g., portion 202 of the OE signal 200 shown enlarged in FIG. 2) caused by plasma emission fluctuations. Specifically, the OE signal 200 is periodically sampled via the processor 122, and collections of consecutive samples are periodically converted from the time domain to the frequency domain (e.g., via a fast fourier transform or a similar technique). For example, if the OE signal 200 is sampled with a 10 kHz sampling rate (e.g., a sample is taken every 0.0001 seconds), a time domain to frequency domain conversion preferably is performed by the processor 122 every 0.1 seconds. In this manner, collections comprising 1000 samples of the OE signal 200 are periodically converted from the time domain to the frequency domain and OE signal frequency components up to about 5 kHz can be monitored over time in 0.1 second intervals. Note that each sample within a 1000 sample collection is normalized by the area under the 1000 sample collection to remove any DC bias within the OE signal.

It will be understood that other sampling rates and other sample collection sizes for time domain to frequency domain conversions may be similarly employed. However, the present inventors have found that an OE signal provides significant process state, process event and process chamber information (described below) when low-frequency components of the OE signal are monitored over time (i.e., optical low-frequency emission (OLE) data). The preferred low frequency component ranges to monitor are less than the RF frequency used to drive the plasma process (e.g., 13.56 MHz), and most preferably are less than about 50 kHz. Low-frequency components of an OE signal having frequencies from about 0 to 300 Hz appear to contain the most significant information as described below with reference to FIGS. 3A–C.

Figure 3A:
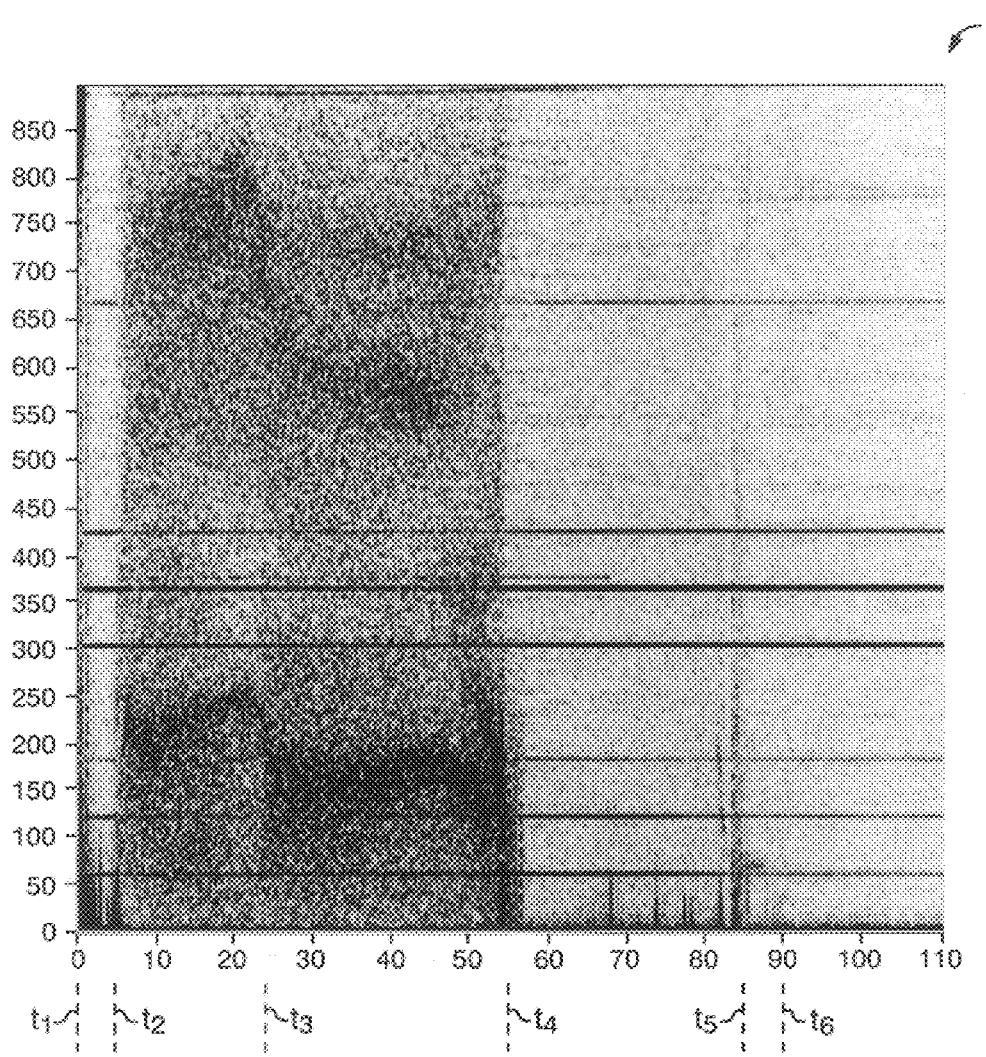
FIG. 3A is a contour graph of optical low-frequency emission (OLE) data generated in accordance with the present invention during aluminum etching.
Figure 3B:
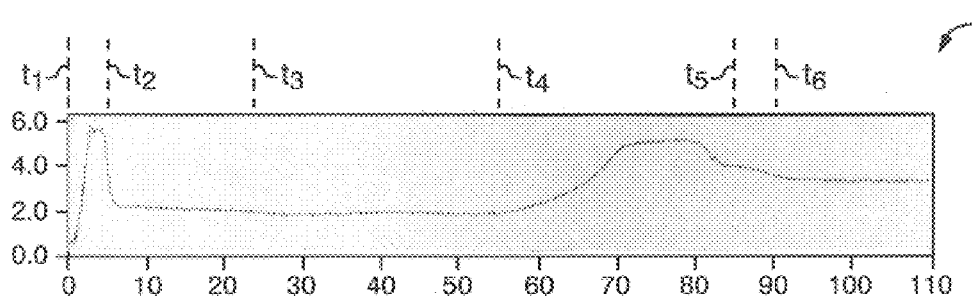
FIG. 3B is a graph of an optical emission spectrum signal from which the OLE data of FIG. 3A was generated.
Figure 3C:
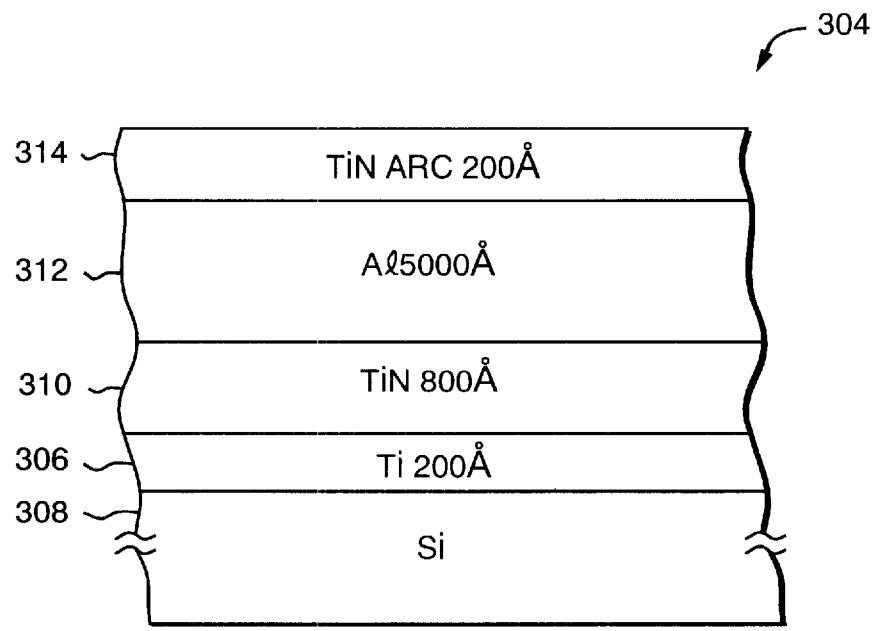
FIG. 3C is a cross-sectional schematic diagram of a multilayer semiconductor structure that was etched so as to generate the optical emission spectrum signal of FIG. 3B.

FIG. 3A is a contour graph of OLE data 300 derived from an OE signal 302 (FIG. 3B) generated during the plasma etching of a multilayer semiconductor structure 304 (FIG. 3C). Darker shading in FIG. 3A indicates larger magnitude; and the OLE data 300 is normalized as previously described. The multilayer semiconductor structure 304 (FIG. 3C) comprises a titanium (Ti) layer 306 (having a thickness of about 200 angstroms) deposited on a silicon (Si) substrate 308, a titanium nitride (TiN) layer 310 (having a thickness of about 800 angstroms) deposited on the titanium layer 306, an aluminum (Al) layer 312 (having a thickness of about 5000 angstroms) deposited on the titanium nitride layer 310 and a titanium nitride anti-reflection coating (TiN ARC) 314 (having a thickness of about 200 angstroms) deposited over the aluminum layer 312.

To obtain the OLE data 300 and the OE signal 302, the multilayer semiconductor structure 304 is placed in the plasma chamber 106 and the plasma 118 is struck, for example, employing Ar, Cl and $BCl_3$ as is well known in the art. Electromagnetic emissions having wavelengths from about 200 to 1100 nanometers that pass through the viewport 114 are collected by the detector 120 (e.g., a silicon photodiode), and the OE signal 302 is generated by the detector 120. The OE signal then is appropriately amplified and is passed to the processor 122. Thereafter, the OE signal 302 is periodically sampled at a sampling rate of 10 kHz, and a fast fourier transform is performed every 0.1 seconds to generate the OLE data 300.

Unlike the raw OE signal 302, the OLE data 300 provides detailed information about the processing events that occur during the etching of the multilayer semiconductor structure 304. For example, in many plasma processes, a wafer is electrostatically held to a wafer pedestal as is well known (i.e., chucking). If chucking is not properly performed, a wafer may vibrate during processing, potentially damaging the wafer and/or generating contaminants within the plasma chamber. Improper chucking, however, is difficult to detect.

With reference to FIG. 3A, the OLE data 300 easily identifies proper and improper chucking. For example, between times $t_1$ and $t_2$, the plasma 118 is struck within the plasma chamber 106 and etching of the multilayer semiconductor structure 304 begins at time $t_2$. Following time $t_2$, OLE data is clearly visible. OLE data only appears during plasma processes in which proper chucking has occurred. Thus, the presence of OLE data clearly identifies proper chucking and the lack thereof clearly identifies improper chucking.

At time $t_2$, chucking of the multilayer semiconductor structure 304 is complete and the plasma etch process begins. Between times $t_2$ and $t_3$, the titanium nitride anti-reflection coating 314 is etched. As can be seen from the OLE data 300, the TiN ARC etching process is distinctly identified by frequency components concentrated primarily between about 150 and 250 Hz. However, as the titanium nitride anti-reflection coating 314 begins to clear near time $t_3$, frequency components above about 200 Hz drop off rapidly, and a clear demarcation between the etching of the titanium nitride anti-reflection coating 314 and the etching of the aluminum layer 312 is observable.

Between times $t_3$ and $t_4$, the etching of the aluminum layer 312 is distinctly identified by frequency components concentrated primarily between about 100 and 175 Hz. However, as the aluminum layer 312 begins to clear near time $t_4$, frequency components above 175 Hz drop off and an abrupt transition occurs at time $t_4$. Between times $t_4$ and $t_5$, the etching of the titanium nitride layer 310 is distinctly identified by the series of frequency component features shown in FIG. 3A. As the titanium nitride layer 310 begins to clear near time $t_5$, frequency components within the OLE data 300 rapidly decrease in magnitude and are no longer detectable at time $t_5$. Similarly, between times $t_5$ and $t_6$, the etching of the titanium layer 306 is distinctly identified by the presence of frequency components (having frequencies less than about 10 Hz) that rapidly decrease in magnitude as the titanium layer 306 is cleared.

Unlike the OE signal 302, the OLE data 300 exhibits a sharp feature as etching of one material layer ends and etching of another material layer begins (i.e., breakthrough). Thus, the OLE data 300 can be analyzed easily for features that identify breakthrough, for halting an etching process immediately at breakthrough (i.e., for stop-on etching) or for endpoint detection. The OLE data 300 also provides information about the process state of the plasma (e.g., RF power, etch rate, wafer damage, wafer temperature, etch uniformity, plasma reaction chemistry, etc.) and about the process chamber (e.g., whether a fault exists, whether one chamber matches another chamber, etc.) by providing a "fingerprint" of the plasma process.

With regard to process state information, because different material layers exhibit different frequency component features during etching and sharp feature transitions between the clearing of one layer and the etching of another layer, the etch rate for each material layer is easily discernible from the,OLE data 300. Etch rate then can be correlated to plasma parameters such as RF power, wafer damage, wafer temperature, etch uniformity, plasma reaction chemistry and the like. Additionally, the shape and the position of the various features within the OLE data 300 provide similar information that may be studied by varying processing parameters or conditions and by examining how the shape and the position of the features within the OLE data 300 change.

With regard to process chamber information, an OLE data fingerprint of a plasma process taken when the plasma chamber 106 is known to be operating properly may serve as a "calibration" fingerprint for the process chamber. Thereafter, the fingerprints of subsequent process runs may be periodically compared to the calibration fingerprint for the process. Drift, feature broadening, noise level or other similar changes in the subsequent fingerprints can be quantified to serve as indicators of the health of the plasma chamber 106, and can identify chamber faults (e.g., via unique OLE data. features attributable to each chamber fault). For example, following a chamber cleaning/ maintenance operation, an OLE data fingerprint may be measured and compared to the calibration fingerprint for the chamber to ensure that the chamber is functioning properly following the cleaning/maintenance operation. The fingerprints of two different chambers also may be compared for chamber matching purposes, or to allow one chamber to be adjusted or "equalized" so as to match the fingerprint of another chamber.

Analysis of the OLE data 300 may be performed manually (e.g., by the user ) or automatically (e.g., by the processor 122) on a run-by-run basis or on a lot-by-lot basis if desired. Preferably analysis is performed as OLE data is collected to allow processing parameters to be adjusted during processing (e.g., in real-time). With reference to FIGS. 1A–1C, the user , a remote computer system for running a fabrication process, a manufacturing execution system, etc., may specify which process events (e.g., improper chucking, breakthrough, endpoint, etc.) the processor 122 should identify, and whether a warning should be sent to the plasma etching system 102 via the second control bus 134 in response thereto (e.g., to halt the plasma process within the plasma chamber 106, ), what process state information is desired (e.g., etch rate, RF power, wafer damage, wafer temperature, etch uniformity, plasma reaction chemistry, etc.), whether real-time process control should be employed; what process chamber information is desired (e.g., chamber fault information, chamber matching information, etc.) and whether the plasma process within the plasma chamber 106 should be halted if a chamber fault is detected.

In addition to the benefits of monitoring a broad wavelength range of electromagnetic emissions (e.g., 200 to 1100 nanometers), the present inventors have discovered that certain plasma emission wavelengths or plasma "lines" also exhibit OLE data features similar to the features of the OLE data 300. Single plasma line measurements may be performed by tuning the monochrometer 126 of FIG. 1B to the appropriate plasma line, or by employing an appropriately spaced diffraction grating, an optical filter, a prism or the like, so as to generate an OE signal for the line, and then by converting the OE signal for the monitored plasma line into OLE data as previously described. The plasma lines for Ar, Cl, Al, AlCl and BCl during a typical aluminum etch process, are listed below in TABLE 1.

TABLE 1

| CHEMICAL SPECIES | PLASMA LINE (nm) |
|---|---|
| Ar | 750.4 |
| Cl | 754.7 |
| Al | 396.4 |
| AlCl | 261.7 |
| BCl | 272.0 |
| Si | 288.0 |

Analysis of the OLE data (not shown) for each plasma line listed in TABLE 1 indicates that during aluminum etching the entire plasma does not exhibit plasma emission fluctuations, rather only specific chemical species exhibit plasma emission fluctuations. More specifically, the Ar and the Cl plasma lines exhibit none of the OLE features observed in the broad wavelength range OLE data (OLE data 300), while the Al, AlCl and BCl plasma lines all exhibit features similar to the features seen in the OLE data 300. Thus, OLE data features appear attributable to reaction products (e.g., Al, AlCl and BCl), making OLE data extremely useful for understanding the reaction chemistry of a plasma process.

Figure 4C:
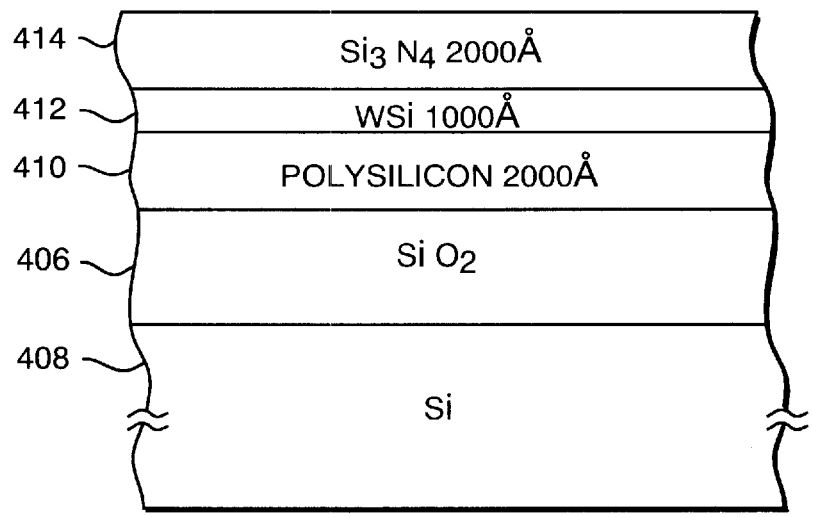
FIG. 4C is a cross-sectional schematic diagram of a polysilicon stack structure that was etched so as to generate the optical emission spectrum signal of FIG. 4B.
Figure 4A:
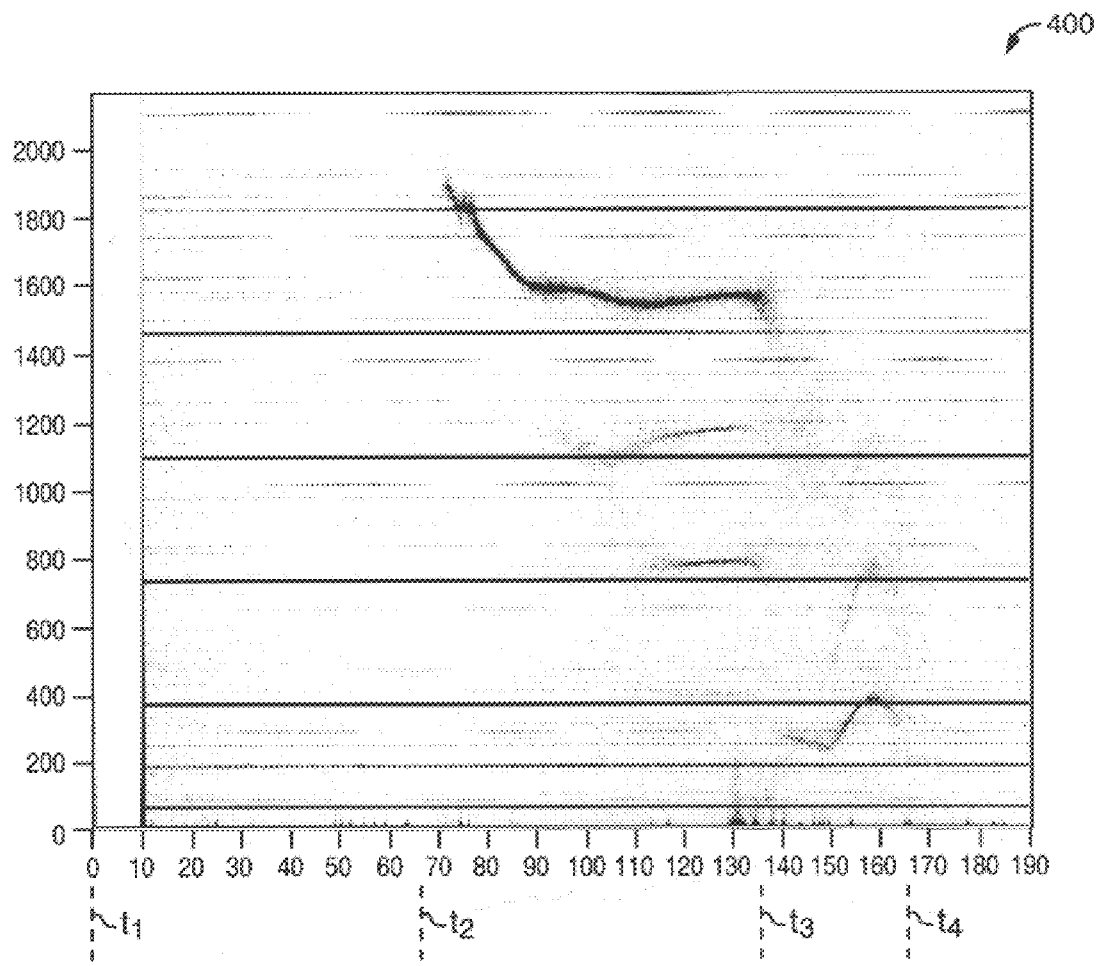
FIG. 4A is a contour graph of optical low-frequency emission (OLE) data generated in accordance with the present invention during polysilicon etching.
Figure 4B:
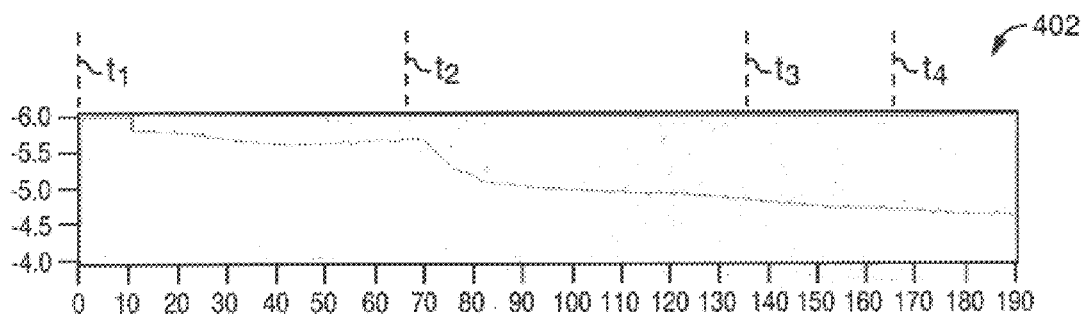
FIG. 4B is a graph of an optical emission spectrum signal from which the OLE data of FIG. 4A was generated.

The inventive plasma monitoring techniques described herein may be used with other plasma processes, such as silicon dioxide etch processes, platinum etch processes, polysilicon etch processes, silicon etch processes or the like. For example, FIG. 4A shows a contour graph of OLE data 400 derived from an OE signal 402 (FIG. 4B) generated during the plasma etching of a polysilicon stack structure 404 (FIG. 4C). The polysilicon stack structure 404 comprises a thick silicon dioxide layer 406 deposited on a silicon (Si) substrate 408, a polysilicon layer 410 (having a thickness of about 2000 angstroms) deposited on the silicon dioxide layer 406, a tungsten silicide (WSi$_x$) layer 412 (having a thickness of about 1000 angstroms) deposited on the polysilicon layer 410, and a silicon nitride layer 414 (having a thickness of about 2000 angstroms) deposited on the tungsten silicide (WSi) layer 412.

To obtain the OLE data 400 and the OE signal 402, the polysilicon stack structure 404 is placed in the plasma chamber 106 and the plasma 118 is struck employing a polysilicon etch chemistry that is well known in the art such as a chlorine-based polysilicon etch chemistry. Electromagnetic emissions from the plasma 118 then are collected, the OE signal 402 is generated by the detector 120 and the OS signal 402 is processed to generate the OLE data 400 as previously described.

With reference to FIG. 4A, between times $t_1$ and $t_2$, the silicon nitride layer 414 and the tungsten silicide layer 412 are etched. Note that no signal within the OLE data 400 is observable during this time period. However, for other processing conditions (e.g., conditions not optimized for a polysilicon etch process), OLE data may be observable during the etching of silicon nitride and tungsten silicide. Thereafter, between times $t_2$ and $t_3$, the polysilicon layer 410 is etched and produces a clear OLE data pattern. At time $t_3$, the polysilicon layer 410 begins to clear, and continues to clear until time $t_4$. After time $t_4$, the silicon dioxide layer 406 is etched and no signal is observable within the OLE data 400. For other processing conditions (e.g., conditions not optimized for a polysilicon etch process), OLE data may be observable during the etching of silicon dioxide (or any other materials not described herein).

Figure 5:
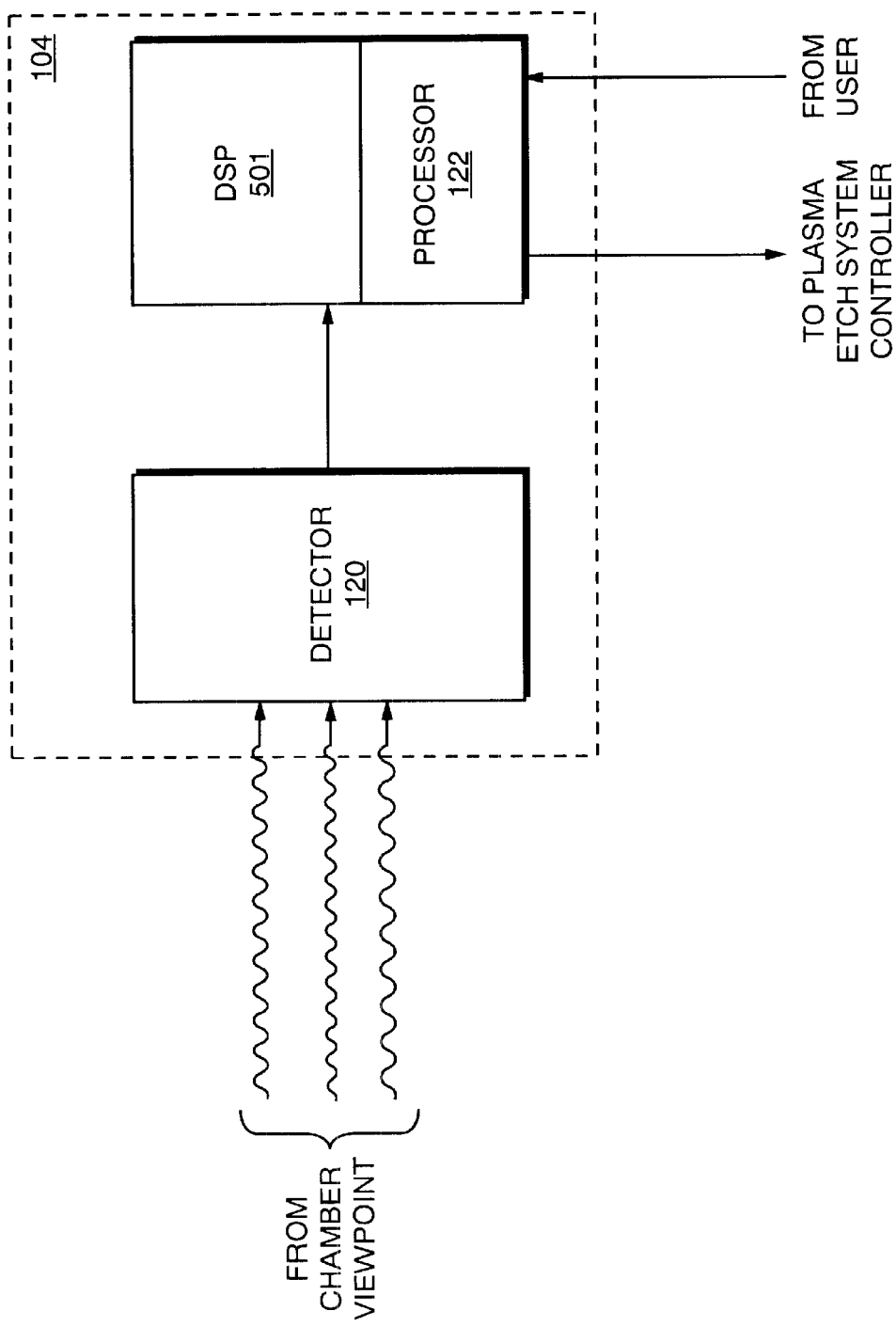
FIG. 5 is a schematic diagram of the inventive process monitoring system of FIGS. 1A–C wherein a dedicated digital signal processor (DSP) is employed.

FIG. 5 is a schematic diagram of the inventive process monitoring system 104 of FIGS. 1A–1C wherein a dedicated digital signal processor (DSP) 501 is employed. The DSP 501 preferably is programmed to perform the time domain to frequency domain conversion of OE signal samples (described previously) at a significantly higher rate than the processor 122 and to supply the resultant frequency components to the processor 122 for analysis. In this manner, analysis of the OLE data may be performed rapidly enough to allow for real-time processing parameter adjustment, if desired.

Figure 6:
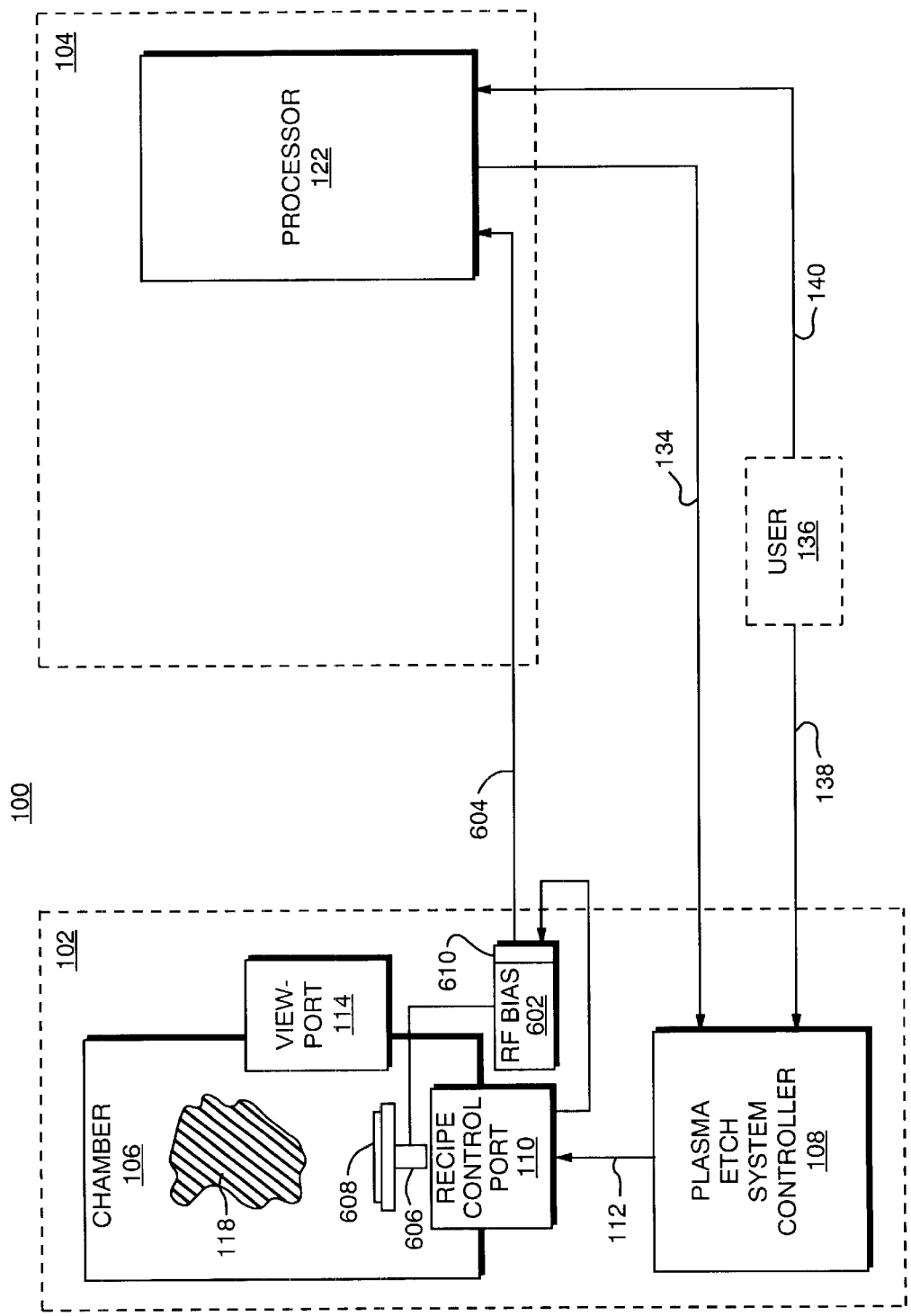
FIG. 6 is a schematic diagram of the plasma processing system of FIGS. 1A–C adapted to monitor RF power fluctuations during plasma processing.

In addition to monitoring plasma emission fluctuations, the present inventors have found that other attributes of a plasma process such as the RF power delivered to a wafer pedestal of a plasma chamber during plasma processing also contains process state, process event and process chamber information. FIG. 6 is a schematic diagram of the processing system 100 wherein the inventive process monitoring system 104 is adapted to monitor RF power fluctuations during plasma processing rather than plasma emission fluctuations. Specifically, within the inventive process monitoring system 104, the detector 120 is no longer shown, and signals representative of the RF power delivered to the plasma chamber 106 are supplied to the processor 122. The RF power signals are supplied from an RF wafer bias generator 602 of the plasma etching system 102 via a fifth control bus 604. It will be understood that the detector 120 may be employed to supply OE signals to the processor 122 along with the RF power signals if desired.

As shown in FIG. 6, the RF wafer bias generator 602 is coupled to the recipe control port 110 (e.g., for receiving the RF power level required for the desired plasma recipe) and to a wafer pedestal 606 located within the plasma chamber 106. The wafer pedestal 606 is shown having a semiconductor wafer 608 disposed thereon. As is known in the art, when an inductively coupled plasma source is employed to generate the plasma 118, typically an RF generator (not shown) drives an RF antenna (not shown) disposed outside the plasma chamber 106, and if a wafer bias is desired, a separate RF wafer bias generator (e.g., the RF wafer bias generator 602) provides the wafer bias. However, when a capacitively coupled plasma source is employed, a second electrode (not shown) is disposed within the plasma chamber 106, and a single RF generator (e.g., the RF wafer bias generator 602) delivers power to both the wafer pedestal 606 and the second electrode.

The RF wafer bias generator 602 comprises a data port such as an analog input/output interface 610 at the backside of the generator for controlling and monitoring the RF power delivered by the generator 602. For example, the interface 610 may provide linear, 0–10 volt, DC voltage outputs that are scaled to represent the power delivered to the„wafer pedestal 606 from the RF generator 602 (i.e., the forward power) and the power reflected from the wafer pedestal 606 back to the RF generator 602 (i.e., the reflected power), or the forward and reflected power signals may be represented in any other analog or digital form with arbitrary scaling. These forward and reflected power signals are provided to the processor 122 as RF power "detection" signals via the fifth control bus 604 and the magnitude of at least one frequency component of one or both RF power detection signals is monitored over time to provide process state, process event and/or process chamber information as described further below. A typical data flow rate for RF power detection signals from the generator 602 is about 9600 Hz (e.g., about ten times faster than the previously described plasma emission fluctuations). In general, signals delivered between any components within the processing system 100, whether or not over a control bus, may be delivered in analog or digital form. For example, analog signals may be digitized via an analog to digital converter and transmitted via an RS-232 interface, a parallel interface, etc., if desired.

As with the plasma emission fluctuations, the processor 122 examines over time local frequency changes in the RF power detection signals. Specifically, the RF power detection signals are periodically sampled via the processor 122, and collections of consecutive samples are periodically converted from the time domain to the frequency domain (e.g., via a fast fourier transform or a similar technique) as previously described. The DSP 501 of FIG. 5 may be employed with the processor 122 for real-time processing parameter adjustment based on the RF power detection signals.

Figure 7A:
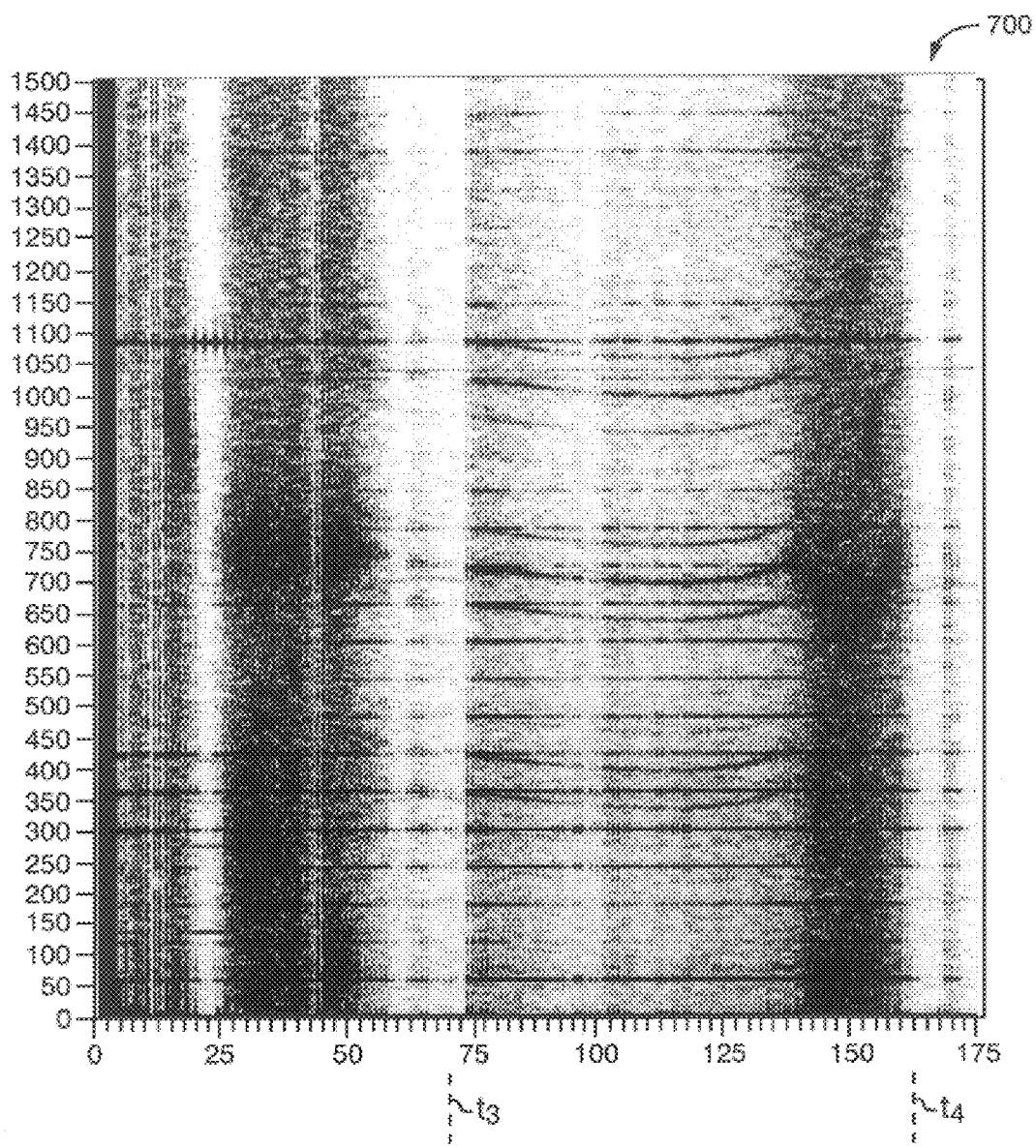
FIG. 7A is a contour graph of data derived from a forward RF power detection signal generated during plasma etching of the multilayer semiconductor structure of FIG. 3C.
Figure 7B:
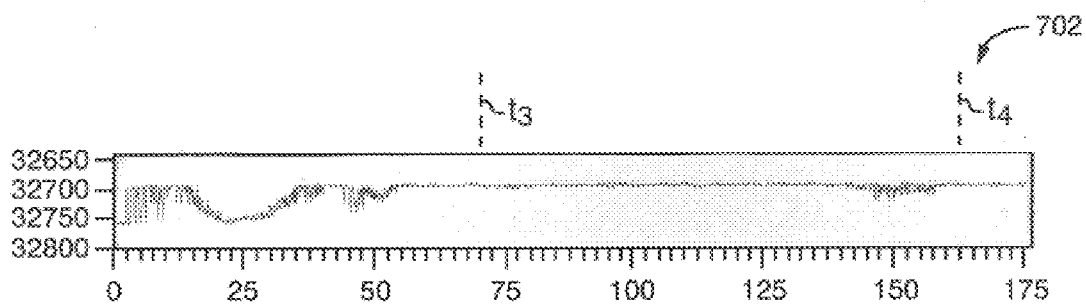
FIG. 7B is a graph of a forward RF power detection signal from which the data of FIG. 7A was generated.

FIG. 7A is a contour graph of data 700 derived from a forward RF power detection signal 702 (FIG. 7B) generated by the interface 610 of the RF wafer bias generator 602 during plasma etching of the multilayer semiconductor structure 304 of FIG. 3C. Darker shading in FIG. 7A indicates larger magnitude. The same processing conditions described with reference to FIGS. 3A–C were employed during etching. Only data corresponding to the time period from about $t_3$ to $t_4$ in FIGS. 3A–B is shown in FIGS. 7A–B.

From the data 700 in FIG. 7A, it is clear that the forward RF power detection signal from the RF wafer bias generator 602 contains the same low frequency component signature as the OLE data 300 of FIG. 3A. Between times $t_3$ and $t_4$, low frequency components are present that drop off abruptly after time $t_4$, indicating the clearing of the aluminum layer 312 near time $t_4$. Note that the forward and reflected RF power signals for an external plasma antenna were analyzed and were found not to contain low frequency component fluctuations. This finding is consistent with the observation that OLE data features appear attributable to reaction products rather than to the plasma as a whole.

Figure 8:
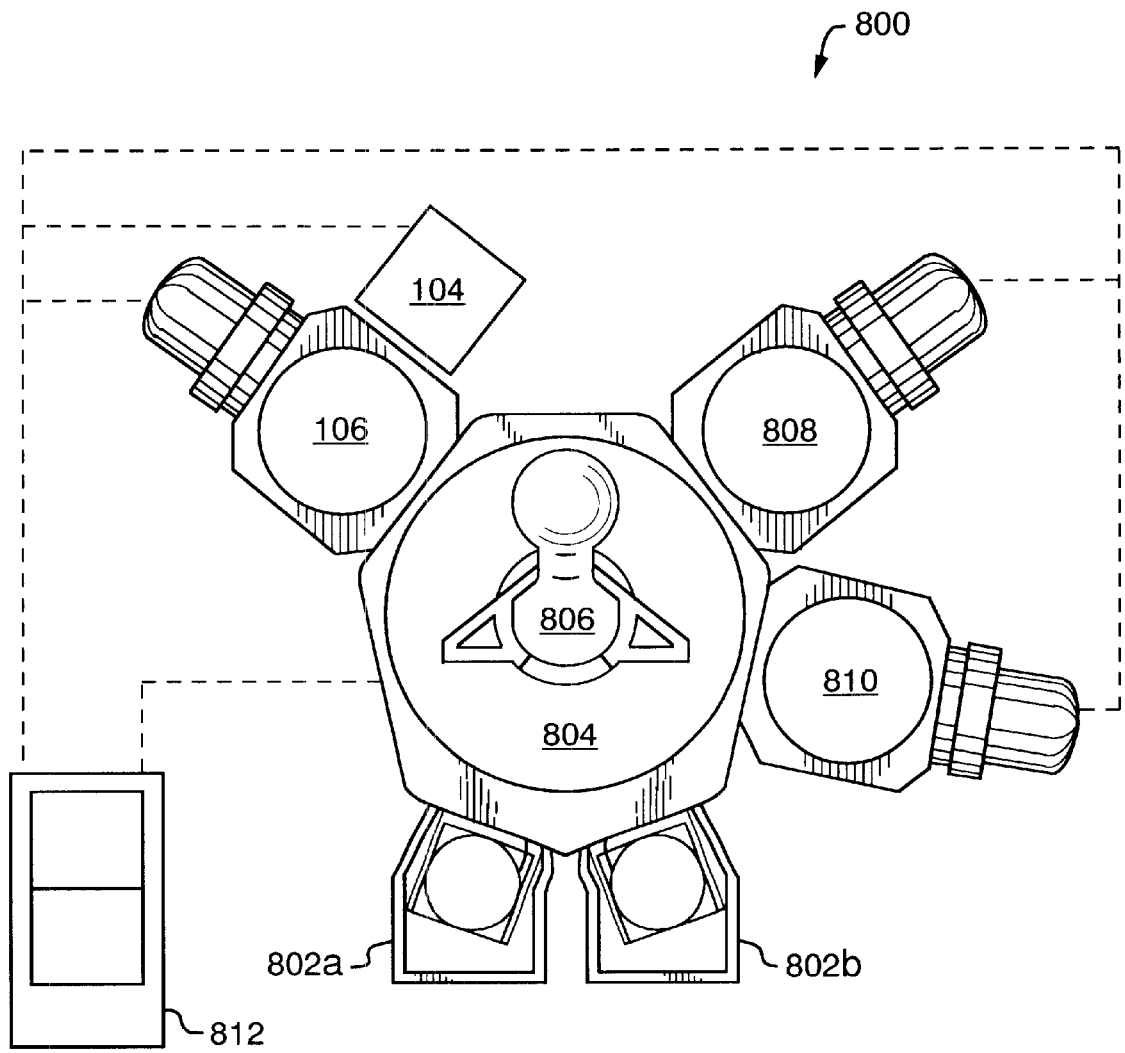
FIG. 8 is a top plan view of an automated tool for fabricating semiconductor devices in accordance with the present invention.

FIG. 8 is a top plan view of an automated tool 800 for fabricating semiconductor devices. The tool 800 comprises a pair of load locks 802a, 802b, and a wafer handler chamber 804 containing a wafer handler 806. The wafer handler chamber 804 and the wafer handler 806 are coupled to a plurality of processing chambers 808, 810. Most importantly, the wafer handler chamber 804 and the wafer handler 806 are coupled to the plasma chamber 106 of the processing system 100 of FIGS. 1A–C or 6. The plasma chamber 106 has the inventive process monitoring system 104 coupled thereto (as shown). The entire tool 800 is controlled by a controller 812 (e.g., a dedicated controller for the tool 800, a remote computer system for running a fabrication process, a manufacturing execution system, etc.) having a program therein which controls semiconductor substrate transfer among the load locks 802a, 802b and the chambers 808, 810 and 106, and which controls processing therein.

The controller 812 contains a program for controlling the process state of the plasma chamber 106 in real-time and for monitoring processing events (e.g., chucking, breakthrough, endpoint, etc.) in real-time via the inventive process monitoring system 104 as previously described with reference to FIGS. 1A–7B. The inventive process monitoring system 104 allows for better control of the process state of the plasma chamber 106 and more accurately identifies when processing events occur therein (effectively increasing the throughput of the plasma chamber 106, ). Accordingly, both the yield and the throughput of the automated fabrication tool 800 increases significantly.

The process of measuring a plasma attribute (e.g., plasma electromagnetic emissions, RF power, etc.), and the monitoring over time of one or more frequency components of a detection signal (e.g., an OE signal, an RF power signal, etc.) may be performed by a user, by a remote computer system for running a fabrication process, by a manufacturing execution system, etc. As stated, analysis and monitoring of detection signal frequency components preferably are performed during processing to allow for real-time process control. Preferably a user, a remote computer system for running a fabrication process, a manufacturing execution system or any other suitable controller, specifies which process events (e.g., improper chucking, breakthrough, endpoint, etc.) the processor 122 should identify, and whether a warning should be sent to the plasma etching system 102 in response thereto (e.g., to halt the plasma process within the plasma chamber 106, ), what process state information is desired (e.g., etch rate, RF power, wafer damage, wafer temperature, etch uniformity, plasma reaction chemistry, etc.), whether real-time process control should be employed, what process chamber information is desired (e.g., chamber fault information, chamber matching information, etc.) and whether the plasma process within the plasma chamber 106 should be halted if a chamber fault is detected. For example, a library of user selectable functions may be provided that direct the processor 122 to obtain desired process state, process event and/or process chamber information and to act thereupon accordingly (e.g., to detect the endpoint of an etch process and to halt processing thereafter).

To identify processing events such as breakthrough and endpoint, and to obtain process chamber information such as chamber fault information and chamber matching information, a database comprising relevant process event or process chamber identification information (e.g., endpoint information, breakthrough information, chamber matching information, etc.) may be provided within the processor 122, within a remote computer system for controlling a fabrication process, within a manufacturing execution system, etc. The relevant information within the database then is accessed by the processor 122 and is used to identify process events or to extract process chamber information. For example, to detect endpoint or breakthrough during the etching of a material layer, a characteristic feature or characteristic features of one or more detection signal frequency components may be identified (as previously described) and stored within the database. Thereafter, during processing, measured detection signal frequency component information may be compared to the frequency component information stored within the database. If the measured frequency component information is within a predetermined range of the stored frequency component information, a signal may be generated to indicate that either endpoint or breakthrough has been detected. One or more characteristic features indicative of endpoint or breakthrough for each material layer to be etched preferably are stored within the database.

With regard to process chamber information, a characteristic frequency component fingerprint of a plasma process taken when the plasma chamber 106 is known to be operating properly may be stored within the database and serve as a "calibration" fingerprint for the process chamber. Thereafter, the fingerprints of subsequent process runs may be periodically compared to the calibration fingerprint for the process stored within the database. Drift, feature broadening, noise level or other similar changes in the subsequent fingerprints can be quantified (e.g., via comparison with the calibration fingerprint) to serve as indicators of the health of the plasma chamber 106; and to identify chamber faults (e.g., via unique frequency component features attributable to each chamber fault that[] are stored within the database). Thus, a calibration fingerprint of a plasma chamber that is operating properly (e.g., a "non-faulted" chamber) may be compared to the fingerprint of a plasma chamber that may have a fault (e.g., a "potentially-faulted" chamber) to determine if the potentially-faulted chamber actually has a fault. For example, following a chamber cleaning/maintenance operation, a frequency component fingerprint may be measured and compared to the calibration fingerprint for the chamber to ensure that the chamber is functioning properly following the cleaning/maintenance operation.

The fingerprints of two different chambers also may be compared for chamber matching purposes, or to allow one chamber to be adjusted or "equalized" so as to match the fingerprint of another chamber (as previously described). Further, the present inventors have discovered that the harmonic frequencies observable within the low frequency components of a detection signal (generated by measuring an attribute of a plasma process) such as those seen in FIGS. 3A, 4A and 7A vary (e.g., shift in frequency) as the state of a plasma varies. These variations provide significant information about a plasma chamber's RF generators and matching networks, as well as information about the plasma process, and can be examined and compared for chamber matching purposes (e.g., to determine the similarity between the RF generators and the matching networks of two chambers) or for chamber health purposes (e.g., to monitor the health of RF generators and the effectiveness of matching networks over time or following chamber maintenance). Harmonic frequency features also may be stored within a database and serve as a calibration fingerprint for subsequent process runs if desired.

The foregoing description discloses only the preferred embodiments of the invention, modifications of the above disclosed apparatus and method which fall within the scope of the invention will be readily apparent to those of ordinary skill in the art. For instance, the monitored frequency component ranges described herein merely are preferred, and other frequency component ranges may be monitored if desired. An RF sensor coupled directly to the wafer pedestal 606 may be used to reduce noise within the RF power detection signal 602. Only one frequency component of the plasma emission fluctuation detection signal or of the RF power detection signal can be monitored if desired.

While the present invention has been described with reference to monitoring the process state of a semiconductor device fabrication process employing a plasma, it will be understood that in general, the present invention may be used to monitor any chemical reaction having an attribute that varies with reaction rate (e.g., whether or not a plasma is employed and whether or not related to semiconductor device fabrication). For example, by monitoring low frequency variations in temperature, pressure, weight (e.g., via a crystal microbalance), chemiluminescence, etc., of an arbitrary chemical reaction, process state information, process event information, and if applicable, process chamber information may be obtained regarding the reaction. Specifically, an attribute of the chemical reaction may be measured so as to generate a detection signal having at least one frequency component (having a magnitude associated therewith); and the magnitude of at least one frequency component of the detection signal (e.g., at least one frequency component associated with a chemical reaction rate of the chemical reaction) may be monitored over time. As another example, deposition processes (e.g., chemical vapor deposition, plasma enhanced chemical vapor deposition and high density plasma chemical vapor deposition processes for the deposition of silicon nitride, tungsten silicide, polysilicon, low or high K materials, III-V or II-VI semiconductors, fluorinated silicon, triethylphosphate (TEPO) and tetraethyl orthosilicate (TEOS) films or any other materials) may exhibit low frequency variations in process attributes (e.g., temperature, pressure, weight, plasma emissions, RF power, etc.) during deposition that contain process state, process event and chamber-related information. Such information may be used to monitor deposition rate, reaction chemistry, RF generator operation, etc., as well as for chamber fault and chamber matching purposes as previously described.

Accordingly, while the present invention has been disclosed in connection with the preferred embodiments thereof, it should be understood that other embodiments may fall within the spirit and scope of the invention, as defined by the following claims.

The invention claimed is:

1. A method of detecting improper chucking during a plasma process, the plasma being generated by application of an RF power signal, the method comprising:

measuring an attribute of the plasma so as to generate a detection signal;

processing the detection signal to generate a first signal indicative of a frequency component of the detection signal, the frequency component having a frequency less than a frequency of the RF power signal;

monitoring over time variations in the magnitude of the first signal;

generating a characteristic fingerprint for the plasma process based on the monitored first signal;

examining the characteristic fingerprint of the plasma process for at least one feature indicative of improper chucking during the plasma process; and equating an occurrence of the at least one feature to improper chucking during the plasma process.

2. The method of claim 1, wherein the processing step includes processing the detection signal to generate a plurality of first signals each indicative of a respective frequency component of the detection signal, each of the frequency components having a frequency less than the frequency of the RF power signal; and wherein the monitoring step includes monitoring the respective magnitudes of the plurality of first signals.

3. The method of claim 1, wherein the frequency component has a frequency associated with a chemical reaction rate of the plasma process.

4. The method of claim 1, wherein the measuring step comprises generating a detector current.

5. The method of claim 1, wherein the measuring step comprises measuring at least one of a forward and a reflected RF power for a wafer pedestal.

6. The method of claim 1, wherein the measuring step comprises measuring other than a broadband optical electromagnetic emission attribute.

7. The method of claim 1, wherein the measuring step includes:

providing an optical filtering mechanism adapted to pass electromagnetic emissions from a chemical species within the plasma; and collecting electromagnetic emissions passed by the optical filtering mechanism.

8. The method of claim 7, wherein the optical filtering mechanism comprises an optical filtering mechanism selected from the group consisting of a glass filter and a monochrometer.

9. The method of claim 7, wherein the chemical species comprises a chemical species selected from the group consisting of BCl, Al, AlCl, Ar, Cl and Si.

10. The method of claim 1, wherein the frequency component has a frequency of less than 13 MHz.

11. The method of claim 10, wherein the frequency component has a frequency of less than 50 kHz.

12. The method of claim 11, wherein the frequency component has a frequency in the range 0–300 Hz.

13. A method of detecting a fault within a potentially-faulted chamber, comprising:

measuring an attribute of a plasma during a plasma process within a non-faulted chamber so as to generate a first detection signal, the plasma being generated by application of an RF power signal;

processing the first detection signal to generate a first signal indicative of a frequency component of the first detection signal, the frequency component having a frequency less than a frequency of the RF power signal;

monitoring over time variations in the magnitude of the first signal;

generating a characteristic fingerprint for the plasma process within the non-faulted chamber based on the monitored first signal;

measuring an attribute of a plasma during a plasma process within the potentially-faulted chamber so as to generate a second detection signal;

processing the second detection signal to generate a second signal indicative of a frequency component of the second detection signal, the frequency component having a frequency less than a frequency of the RF power signal;

monitoring over time variations in the magnitude of the second signal;

generating a characteristic fingerprint for the plasma process within the potentially-faulted chamber based on the monitored second signal;

comparing the characteristic fingerprint of the plasma process within the non-faulted chamber to the characteristic fingerprint of the plasma process within the potentially-faulted chamber; and designating the potentially-faulted chamber as faulted if the characteristic fingerprint of the plasma process within the non-faulted chamber differs from the characteristic fingerprint of the plasma process within the potentially-faulted chamber by more than an amount.

14. The method of claim 13, wherein the non-faulted chamber and the potentially-faulted chamber are the same chamber.

15. The method of claim 13, wherein each processing step includes processing the detection signal to generate a plurality of signals each indicative of a respective frequency component of the detection signal, each of the frequency components having a frequency less than the frequency of the RF power signal; and wherein each monitoring step includes monitoring the respective magnitudes of the plurality of signals.

16. The method of claim 13, wherein each frequency component has a frequency associated with a chemical reaction rate of the plasma process.

17. The method of claim 13, wherein each measuring step comprises generating a detector current.

18. The method of claim 13, wherein each measuring step comprises measuring at least one of a forward and a reflected RF power for a wafer pedestal.

19. The method of claim 13, wherein each measuring step comprises measuring other than a broadband optical electromagnetic emission attribute.

20. The method of claim 13, wherein each measuring step includes:

providing an optical filtering mechanism adapted to pass electromagnetic emissions from a chemical species within the plasma; and collecting electromagnetic emissions passed by the optical filtering mechanism.

21. The method of claim 20, wherein the optical filtering mechanism comprises an optical filtering mechanism selected from the group consisting of a glass filter and a monochrometer.

22. The method of claim 20, wherein the chemical species comprises a chemical species selected from the group consisting of BCl, Al, AlCl, Ar, Cl and Si.

23. The method of claim 13, wherein each frequency component has a frequency of less than 13 MHz.

24. The method of claim 23, wherein each frequency component has a frequency of less than 50 kHz.

25. The method of claim 24, wherein each frequency component has a frequency in the range 0–300 Hz.

26. A method of matching a first chamber to a second chamber, comprising:

measuring an attribute of a plasma during a plasma process within the first chamber so as to generate a first detection signal, the plasma being generated by application of an RF power signal;

processing the first detection signal to generate a first signal indicative of a frequency component of the first detection signal, the frequency component having a frequency less than a frequency of the RF power signal;

monitoring over time variations in the magnitude of the first signal;

generating a characteristic fingerprint for the plasma process within the first chamber based on the monitored first signal;

measuring an attribute of a plasma during a plasma process within the second chamber so as to generate a second detection signal;

processing the second detection signal to generate a second signal indicative of a frequency component of the second detection signal, the frequency component having a frequency less than a frequency of the RF power signal;

monitoring over time variations in the magnitude of the second signal;

generating a characteristic fingerprint for the plasma process within the second chamber based on the monitored second signal;

comparing the characteristic fingerprint of the plasma process within the first chamber to the characteristic fingerprint of the plasma process within the second chamber; and designating the first and second chambers as matching if the characteristic fingerprint of the plasma process within the first chamber differs from the characteristic fingerprint of the plasma process within the second chamber by less than an amount.

27. The method of claim 26, wherein each processing step includes processing the detection signal to generate a plurality of signals each indicative of a respective frequency component of the detection signal, each of the frequency components having a frequency less than the frequency of the RF power signal; and wherein each monitoring step includes monitoring the respective magnitudes of the plurality of signals.

28. The method of claim 26, wherein each frequency component has a frequency associated with a chemical reaction rate of the plasma process.

29. The method of claim 26, wherein each measuring step comprises generating a detector current.

30. The method of claim 26, wherein each measuring step comprises measuring at least one of a forward and a reflected RF power for a wafer pedestal.

31. The method of claim 26, wherein each measuring step comprises measuring other than a broadband optical electromagnetic emission attribute.

32. The method of claim 26, wherein each measuring step includes:

providing an optical filtering mechanism adapted to pass electromagnetic emissions from a chemical species within the plasma; and collecting electromagnetic emissions passed by the optical filtering mechanism.

33. The method of claim 32, wherein the optical filtering mechanism comprises an optical filtering mechanism selected from the group consisting of a glass filter and a monochrometer.

34. The method of claim 32, wherein the chemical species comprises a chemical species selected from the group consisting of BCl, Al, AlCl, Ar, Cl and Si.

35. The method of claim 26, wherein each frequency component has a frequency of less than 13 MHz.

36. The method of claim 35, wherein each frequency component has a frequency of less than 50 kHz.

37. The method of claim 36, wherein each frequency component has a frequency in the range 0–300 Hz.

* * * * *